(12) United States Patent
Tsuzuki

(10) Patent No.: US 6,184,101 B1
(45) Date of Patent: Feb. 6, 2001

(54) METHOD OF MANUFACTURING SEMICONDUCTOR DEVICE REQUIRING LESS MANUFACTURING STAGES

(75) Inventor: Orie Tsuzuki, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/121,900

(22) Filed: Jul. 24, 1998

(30) Foreign Application Priority Data

Jul. 25, 1997 (JP) .................................................... 9-200142

(51) Int. Cl.⁷ .................................................... H01L 21/331
(52) U.S. Cl. .......................... 438/361; 438/637; 257/513
(58) Field of Search ................................. 438/361, 366, 438/637, 639, 640, 672, 673, 638; 257/513, 520

(56) References Cited

U.S. PATENT DOCUMENTS 5,923,073 * 5/1999 Aoki et al. ............................ 257/501

FOREIGN PATENT DOCUMENTS 5-121537  5/1993  (JP).

* cited by examiner

*Primary Examiner*—David Nelms
*Assistant Examiner*—Quoc Hoang
(74) *Attorney, Agent, or Firm*—Young & Thompson

(57) ABSTRACT

A method of forming a semiconductor device, wherein, a silicon oxide film formed on a P-type silicon substrate is patterned, after which element separating trenches with a wider aperture width and a buried layer drawing trench with a narrower aperture width are formed at the same time. The buried layer drawing trench is filled with a conductive film such as a tungsten film, which also forms concave parts at the element separating trenches. The semiconductor is exposed at the bottom parts of the element separating trenches to be etched and form complete element separating trenches penetrating through the buried layer.

8 Claims, 4 Drawing Sheets

METHOD OF MANUFACTURING SEMICONDUCTOR DEVICE REQUIRING LESS MANUFACTURING STAGES

BACKGROUND OF THE INVENTION

The present invention relates to a method of manufacturing a semiconductor device, especially to that requiring less number of manufacturing stages.

DESCRIPTION OF THE RELATED ART

Now that modern semiconductor devices achieved high-integration and high-speed operation, in compliance with such situation, there has been proposed a method for electrical separation between semiconductors, in which an element is encircled by trenches having buried dielectric substances therein.

It has been recognized that an increase of parasitic resistance due to the element becoming microscopic, is one of major reasons that the element is being prevented from achieving higher operation speed. Particularly, as a collector pert of a bipolar transistor would normally use a buried layer, a resistance from a drawer part is added, thus resulting in the element being put under great influence of the increase of parasitic resistance.

In order to resolve such shortcomings, there has been proposed a structure which is capable of lowering the resistance by forming a plug electrode by filling conductive film within the trenches, each trench being provided so as to reach a buried collector (buried layer).

FIGS. 1A, 1B are sectional views for describing a first prior art example. FIGS. 1A, 1B are arranged in an order of manufacturing stages.

First of all, as illustrated in FIG. 1A, an N-type buried layer 2 is formed on a P-type semiconductor substrate 1 so as to grog an N-type epitaxial layer 3. After a silicon oxide film 4 is formed on the epitaxial layer 3, portions of the silicon oxide film 4 corresponding to regions where element separating trenches should be formed, are selected to be etched in order to form apertures 5. Then the portions of the silicon oxide film 4, where the apertures 5 are formed, are used as masks to form element separating trenches 6 which penetrate through the N-type buried layer 2.

Next, silicon oxide films 7 are formed inside the element separating trenches 6, after which BPSG film 8 is grown to fill inside the trenches. After this, the BPSG film 8 on the surface is removed.

Secondly, as shown in FIG. 1B, a portion of the silicon oxide film 4 corresponding to a region where a buried layer drawing trench should be formed is selected to be etched so as to form an aperture. Then the portion of the silicon oxide film 4, where the aperture is formed, is used as a mask to firm a buried layer drawing trench 9. Next, a polycrystal silicon film 10 including phosphorus is grown to fill the buried layer drawing trench 9. After this, the polycrystal silicon film on the surface is removed where buried layer drawing plug electrode (10) is formed.

Subsequently, although further explanatory illustration ,is omitted, the N-type epitaxial layer 3, which is surrounded by element separating trenches would have a base region formed thereon, the base region having an emitter region formed thereon, thus providing a bipolar transistor. In addition, there are possible examples in which metal films like tungsten are used instead of the polycrystal silicon film 10.

In this first prior art example, it is essential that trenches with different depths should be formed separately at the element separating regions and the buried layer drawing region, respectively. Accordingly, in this prior art example, the number of manufacturing stages increases.

Now, as to one option for decreasing the number of manufacturing stages and for simultaneously forming trenches with different depths, there is a disclosure of Japanese Patent Laid-Open Publication No. 5-121537, which will be referred to as a second prior art example.

In the second prior art example, as illustrated in FIG. 2, deeper element separating trenches 6A, and a shallower buried layer drawing trench 9A are formed simultaneously. In this method, silicon oxide film 4 is formed, after which portions of the silicon oxide film 4 corresponding to regions where element separating trenches and a buried layer drawing trench should be formed, are removed. In this process, the silicon oxide film 4 should be patterned in the manner that a width of the buried layer drawing trench is narrower than that of the element separating trench. Then, as the whole surface is etched simultaneously by an application of ECR plasma etching using a mixture of a $SiCl_4$ gas and a $SF_6$ gas, the element separating trenches 6A with wider widths are formed as deeper than the buried layer drawing trench 9A. This is due to the fact that a trench width influences an etching rate.

With respect to the trenches formed by the ECR plasma etching using a mixture of a $SiCl_4$ gas and a $SF_6$ gas, changes of a trench depth with respect to a trench width are shown in FIG. 3, by way of an example.

In the above-described first prior art example, it is essential that trenches with different depths are formed at the element separating regions and the buried layer drawing region, which causes the number of manufacturing stages to increase. Further, for it is required that the element separating regions and the buried layer drawing region should be patterned separately, it is necessary that there are some extra room for adequate position adjustments, which gives a disadvantage that the element is kept from becoming more refined.

On the other hand, it is possible to form trenches with different depths according to the second prior art example, which is disclosed in Japanese Patent Laid-Open Publication No. 5-121537. However, even when the trench depths are set over 5 $\mu$m, the difference between the trench depths and the difference between the trench widths are merely kept almost the same. Accordingly, in order to have the buried layer drawing trench remain within the buried layer, and to have the element separating trenches penetrate through the buried layer so as to maintain a sufficient element separation withstand pressure, the width of the element separating trench should be stretched to become more than a couple $\mu$m wider than the buried layer drawing trench. This will be disadvantageous because the element is prevented from becoming more refined. Besides, in reducing the difference between trench widths, it is impossible to form the element separating trench with a sufficient depth, by which a punch through is easily caused between separate parts of the buried layer. In order to prevent this from happening, at the bottom of the element separating trench, a high density P-type diffusion layer (i.e. a channel stopper layer) should be for led. Thus, a counter inter-substrate capacitance would increase, which prevents the element from achieving a high-speed operation.

SUMMARY OF THE INVENTION

It is therefore an object of the present invention to resolve the above-mentioned problems, and to provide a method of manufacturing a semiconductor device in which the forming stages of a sigh-speed, high-density bipolar transistor are cut down.

According to a first aspect of the present invention, there is provided a method of manufacturing a semiconductor device comprising the steps of: simultaneously forming a first trench with a predetermined aperture width and a second trench with an aperture width wider than the first trench, by an application of a lithography; after forming a first insulating film only on inner sides of the first and the second trenches, piling up a conductive layer such that the first trench would be filled and that the second trench would have a concave part formed therein; exposing the semiconductor substrate only at a bottom part of the second trench; and etching the semiconductor substrate being exposed at the bottom part of the second trench so as to obtain a third trend which is deeper than the first trench.

According to a second aspect of the present invention, there is provided a method of manufacturing a semiconductor device formed by having a second conductive-type epitaxial layer piled up on a first conductive-type semiconductor substrate, comprising the steps of: arranging a semiconductor substrate having a second conductive-type buried layer with high density, at an interface of the first conductive-type semiconductor substrate and the second epitaxial layer and at a vicinity of the interface; simultaneously arranging a first trench with a predetermined aperture width and a second trench with an aperture width wider than the first trench, by an application of a lithography, such that the trenches would reach the buried layer from a surface of the second conductive-type epitaxial layer; after forming a first insulating film only on inner sides of the first and the second trenches, piling up a conductive film such that the first trench is filled and that the second trench would have a concave part formed therein; exposing the buried layer only at a bottom part of the second trench by an application of an anisotropic etching; and etching the buried layer and the first conductive-type semiconductor substrate exposed at the bottom part of the second trench, by the application of a selective etching, so as to obtain a third trench as an element separating trench which is deeper than the first trench.

In the above case, the first conductive-type semiconductor substrate, the second conductive-type epitaxial layer, and the buried layer are all made of silicon, and the conductive film can be a tungsten film.

According to a third aspect of the present invention, there is provided a method of manufacturing a semiconductor device formed by having a second conductive-type epitaxial layer piled up on a first conductive-type semiconductor substrate, comprising the steps of: arranging a semiconductor substrate having a second conductive-type buried layer with a high density at an interface of a first conductive-type semiconductor substrate and a second conductive-type epitaxial layer and at a vicinity of the interface; simultaneously arranging on the second conductive-type epitaxial layer, a first trench with a predetermined aperture width and a second trench with an aperture width wider than the first trench, by an application of a lithography; after forming a second insulating film only on inner sides of the first and the second trenches, piling up a polycrystal silicon film serving as a conductive film, which is doped to be a second conductive-type, such that the first trench would be filled and that the second trench would have a concave part formed therein; exposing the buried layer only at a bottom part of the second trench by an application of an anisotropic etching; forming a thermal oxidation film on the inner sides of the first trench, on the polycrystal silicon film and the buried layer at the bottom surface of the trench, and on the polycrystal silicon layer which fills the second trench, by an application of a thermal oxidation, thus forming a second conductive-type diffusion layer which reaches the first conductive-type semiconductor substrate from the bottom surface of the first trench; and removing the thermal oxidation film at the bottom surface of the second trench, so as to etch the first conductive-type semiconductor substrate and the buried layer being exposed at the bottom surface of the second trench by an application of a selective etching, in order to arrange a third trench as an element separating trench which is deeper than the first trench.

In the above case, the first conductive-type semiconductor substrate, the second conductive-type epitaxial layer, and the buried layer can all be made of silicon.

In accordance with the present invention, it is possible to simultaneously form the first and the second trenches, having different aperture widths, by a single lithographic stage. Therefore, there should be no need for extra room for position adjustments among trenches. Furthermore, after embedding the conductive film in the first trench having a narrower aperture width, the third trench is formed by having the bottom surface of the second trench, which has a wider aperture width, etched. Consequently, it is possible to arbitrary set the depths of the first, the second and the third trenches.

The above and further objects and the novel feature of the invention will more fully appear from the following detailed description when the same is read in connection with the accompanying drawings. It is to be expressly understood, however, teat the drawings are for illustration only and are not intended as a definition of the limits of the invention.

DESCRIPTION OF THE PREFERRED EMBODIMENTS

Figure 1A:
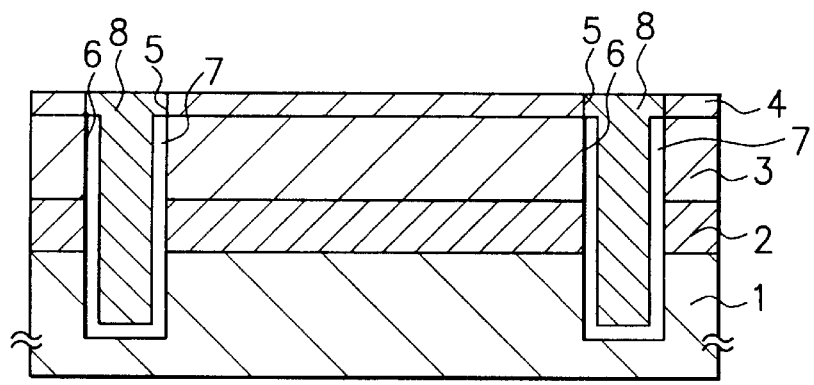
FIG. 1A is a sectional view showing a first manufacturing stage according to a first prior art example.
Figure 1B:
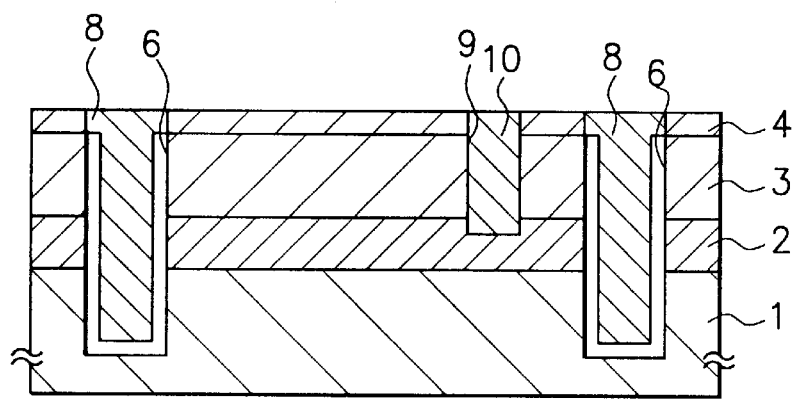
FIG. 1B is a sectional view showing a second manufacturing stage according to the first prior art example.
Figure 2:
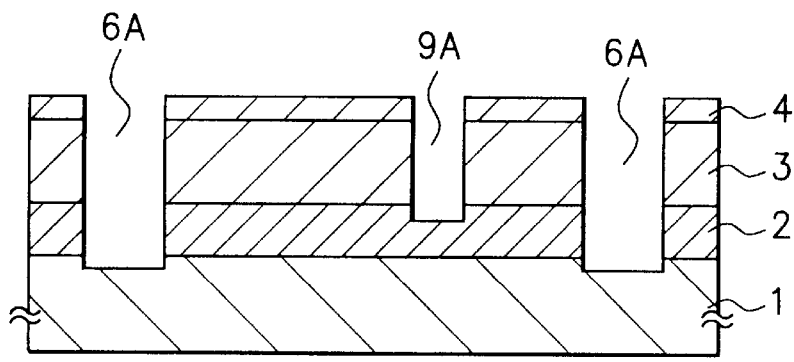
FIG. 2 is a sectional view showing a second prior art example.
Figure 3:
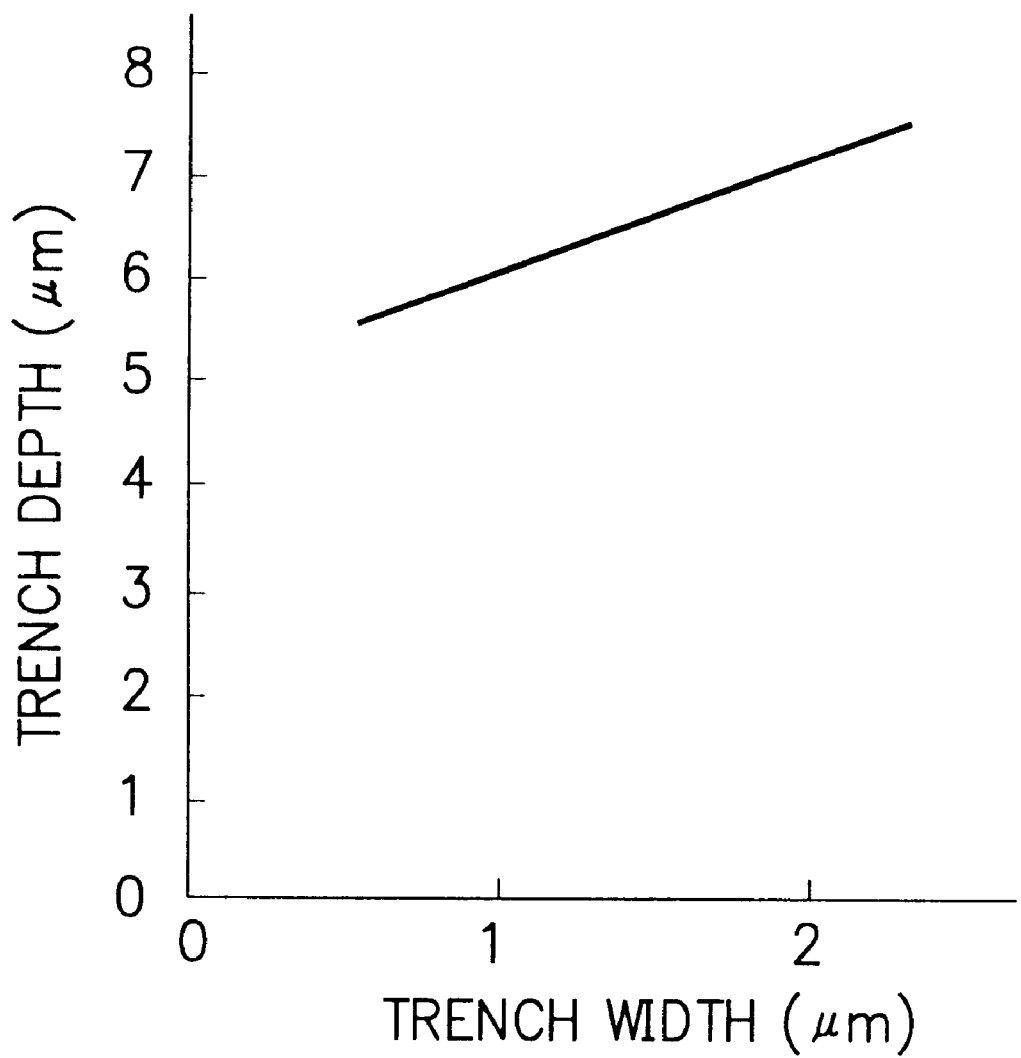
FIG. 3 is a graphical representation showing a relationship between a trench width and a trench depth, when the trench is formed by an ECR plasma etching using a mixture of a $SiCl_4$ gas and a $SF_6$ gas.

Referring now to the drawings, a description of preferred embodiments of the present invention will be described in detail.

Figure 4A:
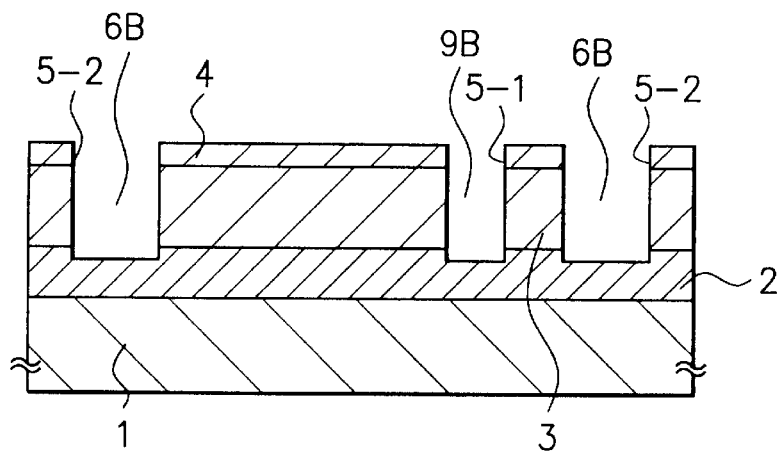
FIG. 4A is a sectional view showing a first manufacturing stage according to a first embodiment of the present invention.
Figure 4B:
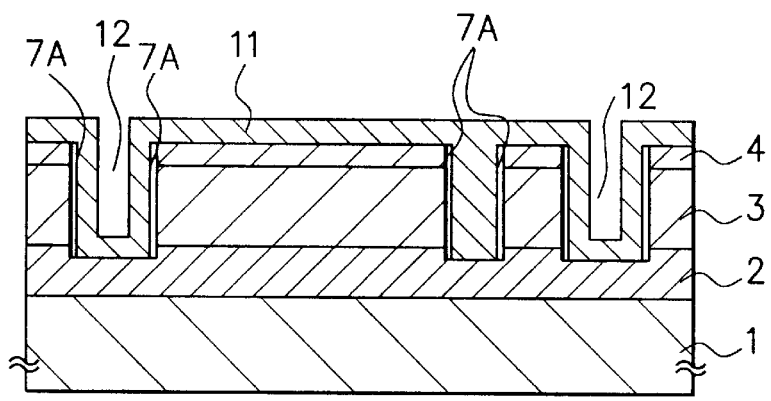
FIG. 4B is a sectional view showing a second manufacturing stage according to the first embodiment of the present invention.
Figure 4C:
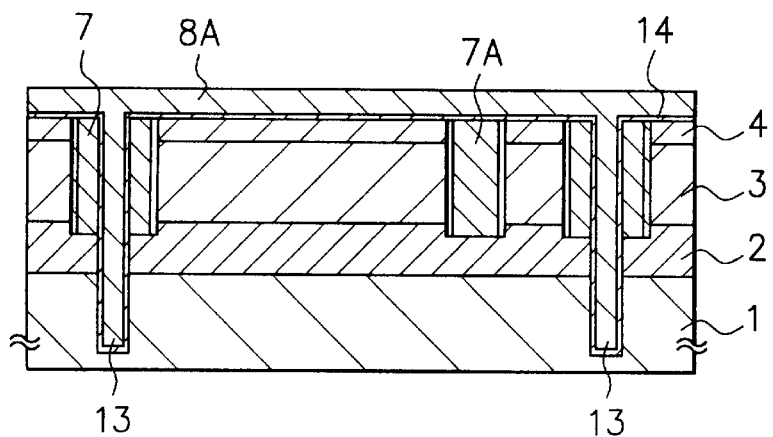
FIG. 4C is a sectional view showing a third manufacturing stage according to the first embodiment of the present invention.

FIGS. 4A, 4B, 4C are sectional views of a first embodiment of the present invention. The four views are arranged in an order of manufacturing stages.

First, as FIG. 4A shows, an N-type epitaxial layer 3 (with an impurity density of $1\times10^{16} cm^{-3}$, and a thickness between 0.5~1.5 μm) is piled up on a P-type silicon substrate 1. A semiconductor substrate having an N⁺-type buried layer 2 (with a thickness of 1.5~2.5 μm) is arranged at an interface of the P-type silicon substrate I and the N-type epitaxial layer 3 and at the vicinity of the interface. Then after the silicon oxide film 4 is formed as having a thickness of about 0.5 μm, portions of the silicon oxide film 4 corresponding to forming regions of element separating trenches and a buried layer drawing trench are selected to be removed. Thus apertures 5-1 and 5-2 are formed. In this occasion, a width of the element separating trench forming region (a width of the aperture 5-2) is made wider than a width of the buried layer drawing trench (a width of the aperture 5-1). It is preferred, however, that the difference between tho two widths is more than 0.4 μm. For example, when the width of the element separating trench forming region is about 1.2 μm, the width of the buried layer drawing trench forming region is to be about 0.6 μm. Next, by having portions of the selected silicon oxide film 4 as masks, element separating trenches 6B, which reach the buried layer 2, and a buried layer drawing trench 9B are formed by an anisotropic etching (an etching rate would hardly depend on the width of the aperture) employing a mixture of a HBr gas and a HCl gas. Here, the element separating trenches 6B are considered as second trenches, and the buried layer drawing trench 9B is considered as a first trench. To be precise, the element separating trenches 6B are not complete trenches yet at this point.

Second, as illustrated in FIG. 4B, a thermal oxidation film 7A is arranged in the inner surfaces of the element separating trenches 6B and the buried layer drawing trench 9B with the thickness of about 20 nm. After this, due to the application of an anisotropic etching, the element separating trenches 6B and the buried layer drawing trench 9B will have the thermal oxidation film 7A remained over their inner sides, except for their bottom parts where the buried layer 2 is being exposed. Then a tungsten film 11 is formed to the thickness of about 0.4 μm by a vapor growth. Inside the buried layer drawing trench 9B is filled with the tungsten film 11, by which concaves 12 are formed at the element separating trenches 6B. At this time, the film thickness of the tungsten film 11 should be set to equal to or more than half the width of the buried layer drawing trench 9B and under half the width of the element separating trench 6B.

Third, as shown in FIG. 4C, an anisotropic etching is practiced on the tungsten film 11, by which the buried layer 2 is to be exposed at the bottom parts of the element separating trenches 6B. Next, the silicon oxide film 4 and the tungsten film 11 are used as masks to conduct anisotropic etching at the bottom sections of the element separating trenches 6B in order to form an element separating trenches 18 as third trenches that penetrate through the buried layer 2. To be precise, the element separating trench 6B and the element separating trench 13 are not separate trenches but form together one complete element separating trench. Then after having the silicon oxide film 14 formed on the whole surface to the thickness of about 20 nm, the BPSG film 8A is grown to the thickness of about 0.5 μm, such that it fills the element separating trench 13.

Then, after the BPSG film 8A is removed by an application of an etch-back method or the CMP method, the N-type epitaxial layer 3 being surrounded by the element separating trenches 6B is formed on the base region by the use of an ion implantation. Then an emitter region is formed on the base region, by which a bipolar transistor is finally constructed.

According to the first embodiment, the first trench (the buried layer drawing trench) and the second trench (a part of the element separating trench) are formed simultaneously by a single lithographic stage. Therefore, only a few stages are required, and there should be no extra room needed for position adjustments among trenches. Further, after having the conductive film embedded in the first trench having a narrower aperture width, the second trench with a wider aperture width is to have its bottom surface etched to form a deeper third trench. Thus, it is possible to arbitrary set the depths of the first, the second, and the third trenches, and to form element separating trenches with a sufficient depth. Accordingly, it is possible to make the element microscopic, and to achieve a high-speed operation.

FIGS. 5A, 5B, 5C, 5D are sectional views showing a second embodiment of the invention in an order of manufacturing stages.

Figure 5A:
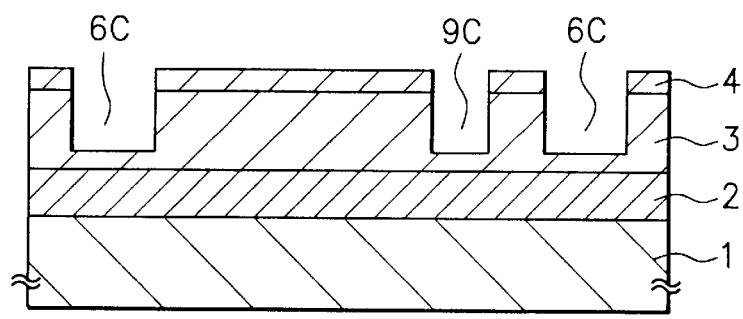
FIG. 5A is a sectional view showing a first manufacturing stage according to a second embodiment of the present invention.

First, as shown in FIG. 5A, in the same manner as in the first embodiment, the second embodiment has a P-type silicon substrate 1, upon which a semiconductor substrate having the N-type epitaxial layer 3 is piled up. Then the silicon oxide film 4 is formed and being patterned. An element separating trenches 6C and a buried layer drawing trench 9C are formed simultaneously with depths not reaching the buried layer 2. The element separating trenches 6C and the buried layer drawing trench 9C can be set to become almost the same as the element separating trenches 6B and the buried layer drawing trench 9B in the first embodiment, except for their depths.

Figure 5B:
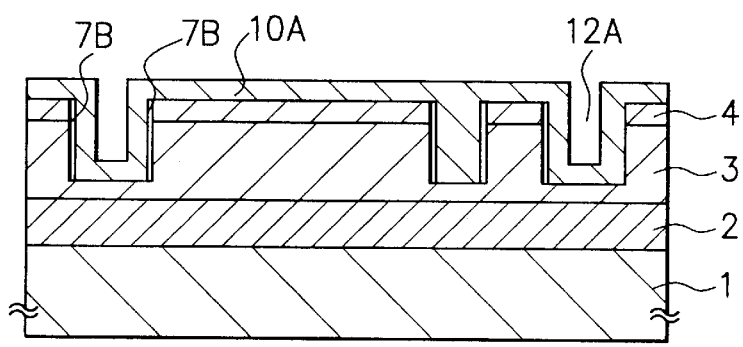
FIG. 5B is a sectional view showing a second manufacturing stage according to the second embodiment of the present invention.

Second, as shown in FIG. 5B, the element separating trenches 6C and the buried layer drawing trench 9C would have formed inside a thermal oxidation film 7B with the thickness of about 20 cm. After that, the thermal oxidation film 7B is to remain at inner sides of the element separating trenches 6C and the buried layer drawing trench 9C such that the N-type epitaxial layer 3 is exposed at bottom parts of the trenches. Next, the polycrystal silicon film 10A including phosphorus, which is an N-type impurity, is formed to the thickness of about 0.4 μm by a vapor growth. Thus, the buried layer drawing trench 9C will be filled with the polycrystal silicon film 10A, while the element separating trenches 6C will have concave sections 12A formed with the polycrystal silicon film 10A. In this occasion, a density of the impurities included in the polycrystal silicon film 10A is set between $0.5~5.0\times10^{20} cm^{-3}$. Further, with respect to the impurities, it is possible to use an arsenic and an antimony.

Figure 5C:
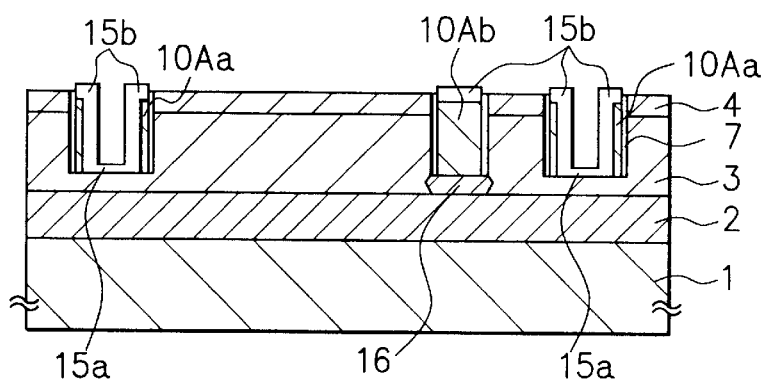
FIG. 5C is a sectional view showing a third manufacturing stage according to the second embodiment of the present invention.

Third, as it is shown in FIG. 5C, an anisotropic etching is practiced over the polycrystal silicon film 10A, by which the N-type epitaxial layer 3 is exposed at the bottom parts of the element separating trenches 6C. Next, a heat treatment is conducted in the oxygen atmosphere under 900° C. for about 50 minutes. At this moment, there are formed a thermal oxidation film 15a having a thickness of about 30 nm due to an oxidation of the N-type epitaxial layer 3, and a thermal oxidation film 15b having a thickness between 100~200 nm due to an oxidation of the polycrystal silicon film 10A.

This is caused because each film has different impurity density. As to a difference between the impurity densities of the N-type epitaxial layer being exposed at the bottom parts of the polycrystal silicon film 10A and the element separating trenches 6C, as it will be explained later, it is sufficient enough to have an oxide film being formed on the polycrystal silicon film with a film thickness in the extent that the oxide film is remained on the polycrystal silicon film 10A when the silicon is to be exposed at the bottom parts of the element separating trenches 6C. Preferably, it should be about one digit number. If there is such an impurity density difference as described, there should be no problem even if the buried layer drawing trench 9C is to reach the buried layer 2. Further, owing to this heat treatment, the phosphorus included in the polycrystal silicon film 10A which is embedded in the buried layer drawing trench 9C is to be diffused to the N-type epitaxial layer 3 to reach the buried layer 2, so that eventually an N-type diffusion region 16 is formed. Moreover, the inner sides of the element separating trenches 6C and of the buried layer drawing trench 9C are to have the polycrystal silicon films 10Aa and 10Ab remained, respectively.

Figure 5D:
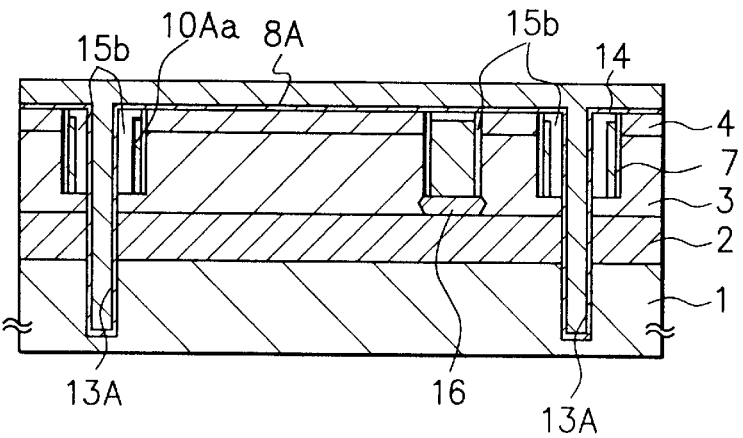
FIG. 5D is a sectional view showing a fourth manufacturing stage according to the second embodiment of the present invention.

Fourth, as shown in FIG. 5D, the thermal oxidation films 15a and 15b are etched to have the silicon exposed at the bottom parts of the element separating trenches 6C. At this time, the thermal oxidation film 15b, which is being formed by oxidizing the polycrystal silicon film 10A, is thicker than the thermal oxidation film 15a at the bottom, for which the thermal oxidation film 15b is to be remained. Next, an anisotropic etching is practiced over the exposed bottom surfaces by having the silicon oxide film 4 and the thermal oxidation film 15b used as masks, thus completing the element separating trench by forming an element separating trench 13A that penetrates through the buried layer 2. Then the silicon oxide film 14 is formed on the whole surface of the device to the thickness of about 20 nm, after which the BPSG film 8A is grown to the thickness of about 0.5 $\mu$m, eventually filling the element separating trench 13A.

After that, in the same manner as in the first embodiment, the base region and the emitter region are formed on the N-type epitaxial layer 3 within an area surrounded by the element separating trenches 6C, thus forming a bipolar transistor.

According to the embodiments of the present invention, for the polycrystal silicon film is used as a buried conductive film, there should be no particular consideration given on a heat treatment temperature, metal contamination, etc. which provides an advantageously high flexibility.

In the previously described embodiments of the present invention, it is possible to form trenches after having the base region and the emitter region formed. Further, the formation stages and a type of conductivity of the impurity which is introduced to the silicon substrate have no relationship among each other. It is also possible to combine an opposite type of conductivity to the ones shown in the above embodiments.

In accordance with the present invention, the first and the second trenches having different aperture widths are formed by a single lithographic stage. Moreover, the second trench having a bigger aperture width is to have the conductive film formed on the inner sides thereof, and in collation with this, the third trench is formed at the bottom part of the second trench. Therefore, it is possible to independently arrange two kinds of trench depths without having to case an increased number of manufacturing stages.

Accordingly, when the first trench is considered as the buried layer drawing region, and the second and the third trenches as the element separating trenches, then the device is capable off acquiring a microscopic characteristic and an element separation pressure withstanding.

While preferred embodiments of the invention have been described using specific terms, such description is for illustrative purposes only, and it is to be understood that changes and variations may be made without departing from the spirit or the scope of the following claims.

What is claimed is:

1. A method of manufacturing a semiconductor device comprising the steps of:

simultaneously forming a first trench with a predetermined aperture width and a second trench with an aperture width wider than the first trench, by an application of a lithography;

after forming a first insulating film only on inner sides of the first and second trenches with bottoms of the trenches being free of the insulating film, piling up a conductive layer such that the first trench would be filled and that the second trench would have a concave part formed therein;

exposing the semiconductor substrate only at a bottom part of the second trench;

etching the semiconductor substrate being exposed at the bottom part of the second trench so as to obtain a third trench which is deeper than the first trench.

2. A method of manufacturing a semiconductor device comprising the steps of:

arrange over a first conductive-type semiconductor substrate contacting a se conductive-type buried layer with a high density, and a second conductive-type epitaxial layer over and, contacting said buried layer;

simultaneously arranging a first trench with a predetermined aperture width and a second trench with an aperture width wider than the first trench, by an application of a lithography, such that the trenches would reach the buried layer from a surface of the second conductive-type epitaxial layer;

after forming a first insulating film limited to the inner sides of the first and the second trenches, piling up a conductive film such that the first trench is filled and that the second trench would have a concave part formed therein and the conductive film directly contacts said buried layer;

exposing the buried layer only at a bottom layer of the second trench by an application of an anisotropic etching; and etching the buried layer and the first conductive-type semiconductor substrate exposed at the bottom part of the second trench, by the application of a selective etching, so as to obtain a third trench as an element separating trench which is deeper than the first trench.

3. A method of manufacturing a semiconductor device according to claim 2, wherein the first conductive-type semiconductor substrate, the second conductive-type epitaxial layer, and the buried layer are all made of silicon, and the conductive film is a tungsten film.

4. A method of manufacturing a semiconductor device formed by having a second conductive-type epitaxial layer piled up on a first conductive-type semiconductor substrate, comprising the steps of:

arranging a semiconductor substrate having a second conductive-type buried layer with a high density, at an interface of a first conductive-type semiconductor substrate and a second conductive-type epitaxial layer and at a vicinity of the interface;

simultaneously arranging on the second conductive-type epitaxial layer, a first trench with a predetermined aperture width and a second trench with an aperture width wider than the first trench, by an application of a lithography;

after forming a second insulating film only on inner sides of the first and the second trenches, piling up a polycrystal silicon film serving as a conductive film, which is doped to be a second conductive-type, such that the first trench would be filled and that the second trench would have a concave part formed therein;

exposing the buried layer only at a bottom part of the second trench by an application of an anisotropic etching;

forming a thermal oxidation film on the inner sides of the first trench, on the polycrystal silicon film and the buried layer at the bottom surface of the trench, and on the polycrystal silicon layer which fills the second trench, by an application of a thermal oxidation, thus forming a second conductive-type diffusion layer which reaches the first conductive-type semiconductor substrate from the bottom surface of the first trench; and removing the thermal oxidation film at the bottom surface of the second trench, so as to etch the first conductive-type semiconductor substrate and the buried layer being exposed at the bottom surface of the second trench by an application of a selective etching, in order to arrange a third trench as an element separating trench which is deeper than the first trench.

5. A method of manufacturing a semiconductor device according to claim 4, wherein the first conductive-type semiconductor substrate, the second conductive-type epitaxial layer, and the buried layer are all made of silicon.

6. The method of claim 1, wherein said third trench is filled with a BPSG film to form an element separating trench.

7. The method of claim 2, wherein said third trench is filled with a BPSG film to form an element separating trench.

8. The method of claim 4, wherein said third trench is filled with a BPSG film to form an element separating trench.

* * * * *